United States Patent
Sanson et al.

(10) Patent No.: US 6,815,716 B2
(45) Date of Patent: Nov. 9, 2004

(54) TFT MATRIX FOR OPTICAL SENSOR COMPRISING A PHOTOSENSITIVE SEMICONDUCTOR LAYER, AND OPTICAL SENSOR COMPRISING SUCH AN ACTIVE MATRIX

(75) Inventors: Eric Sanson, Grenoble (FR); Nicolas Szydlo, Grenoble (FR)

(73) Assignee: Thales Avionics LCD S.A., Paris (FR)

( * ) Notice: Subject to any disclaimer, the term of this patent is extended or adjusted under 35 U.S.C. 154(b) by 42 days.

(21) Appl. No.: 10/380,757

(22) PCT Filed: Sep. 18, 2001

(86) PCT No.: PCT/FR01/02900
§ 371 (c)(1),
(2), (4) Date: Mar. 18, 2003

(87) PCT Pub. No.: WO02/25699
PCT Pub. Date: Mar. 28, 2002

(65) Prior Publication Data
US 2004/0036092 A1 Feb. 26, 2004

(51) Int. Cl.[7] ............................................. H01L 29/04
(52) U.S. Cl. ...................... 257/59; 257/72; 250/370.09
(58) Field of Search ............................. 257/59, 72, 350, 257/532, 773, 776, 355; 250/370.09

(56) References Cited

U.S. PATENT DOCUMENTS

| 4,794,045 A | 12/1988 | Robin et al. |
| 4,906,949 A | 3/1990 | Pocholle et al. |
| 4,917,450 A | 4/1990 | Pocholle et al. |
| 4,927,223 A | 5/1990 | Pocholle et al. |
| 4,927,245 A | 5/1990 | Papuchon et al. |
| 4,943,144 A | 7/1990 | Delacourt et al. |
| 5,055,422 A | 10/1991 | Weisbuch et al. |
| 5,077,466 A | 12/1991 | Delacourt et al. |
| 5,077,750 A | 12/1991 | Pocholle et al. |
| 5,086,433 A | 2/1992 | Pocholle et al. |
| 5,088,096 A | 2/1992 | Pocholle et al. |
| 5,105,428 A | 4/1992 | Pocholle et al. |
| 5,123,025 A | 6/1992 | Papuchon et al. |
| 5,128,948 A | 7/1992 | Papuchon et al. |

(List continued on next page.)

FOREIGN PATENT DOCUMENTS

EP 0 814 515 A2 12/1997

OTHER PUBLICATIONS

U.S. patent application Publication No. US 2002/0122448 A1; Sep. 5, 2002.
Patent Abstract of Japan; Publication No. 11–274446; Publication Date Oct. 8, 1999; with Japanese Application No. 10071692 filed Mar. 20, 1998.
Patent Abstract of Japan; Publication No. 200353808; Publication Date Dec. 19, 2000.
Boer et al; "Similarities bet ween TFT Arrays for Direct-Conversion X–Ray Sensors and High Aperture AMLCDs" 1999 SID International Symposium Digest of Technical Papers, Anaheim California, May 17 t 22, 1998, vol. 20, 1998, pp. 371–374, XP000965457.

*Primary Examiner*—Mark V. Prenty
(74) *Attorney, Agent, or Firm*—Lowe Hauptman GIlman & Berner, LLP

(57) ABSTRACT

The invention concerns an active TFT matrix for optical sensor comprising a substrate, a TFT transistor matrix formed on said substrate, a set of transistor control lines (3): a conductor level (4) according to a specific pattern forming an electrode array (5), each electrode (5) defining a zone called pixel: a set of columns (10) for load transfer between the electrodes (5) and an external electronics. The pixel electrode (5) is located entirely inside an outline delimited by two lines (3) and two successive columns (10), a protective gap (g1, g2) being provided between the inside edge of said outline and the periphery of the pixel (5) such that the pixel electrode (5) does not cover either the lines (3) or the columns (10).

10 Claims, 4 Drawing Sheets

U.S. PATENT DOCUMENTS

| | | |
|---|---|---|
| 5,138,628 A | 8/1992 | Pocholle et al. |
| 5,160,991 A | 11/1992 | Delacourt et al. |
| 5,173,910 A | 12/1992 | Pocholle et al. |
| 5,222,093 A | 6/1993 | Pocholle et al. |
| 5,243,617 A | 9/1993 | Pocholle et al. |
| 5,247,168 A | 9/1993 | Pocholle et al. |
| 5,289,309 A | 2/1994 | Delacourt et al. |
| 5,311,540 A | 5/1994 | Pocholle et al. |
| 5,369,524 A | 11/1994 | Pocholle et al. |
| 5,375,131 A | 12/1994 | Pocholle et al. |
| 5,384,801 A | 1/1995 | Pocholle et al. |
| 5,444,571 A | 8/1995 | Debuisschert et al. |
| 5,570,387 A | 10/1996 | Carriere et al. |
| 5,838,710 A | 11/1998 | Larat et al. |
| 5,912,455 A | 6/1999 | Pocholle et al. |
| 6,307,623 B1 | 10/2001 | Papuchon et al. |
| 6,323,490 B1 * | 11/2001 | Ikeda et al. ............ 250/370.09 |
| 6,430,206 B1 | 8/2002 | Debuisschert et al. |
| 2004/0036092 A1 * | 2/2004 | Sanson et al. .............. 257/213 |

* cited by examiner

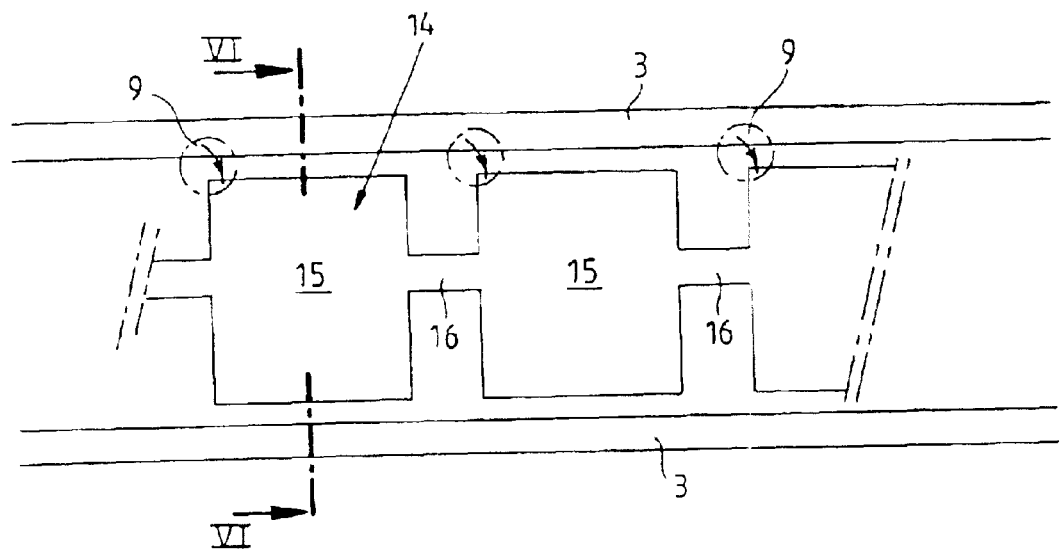
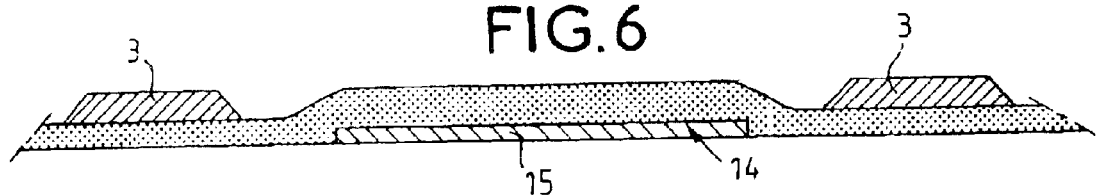
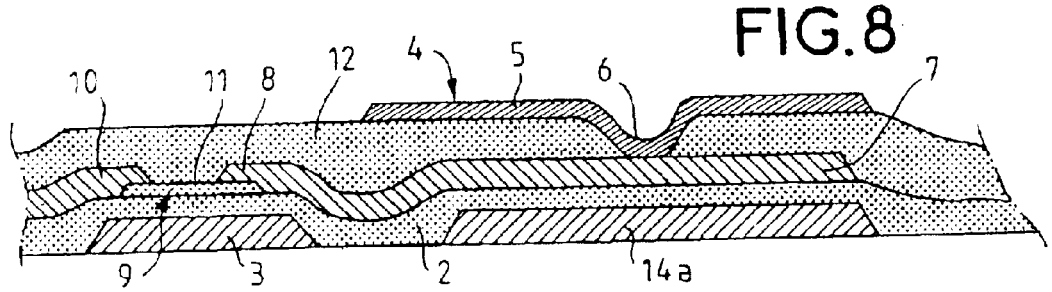
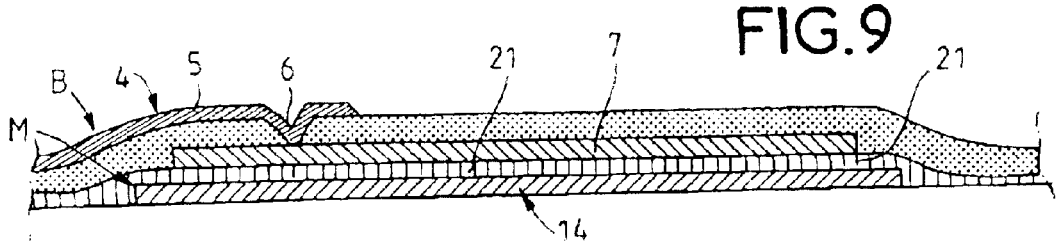

TFT MATRIX FOR OPTICAL SENSOR COMPRISING A PHOTOSENSITIVE SEMICONDUCTOR LAYER, AND OPTICAL SENSOR COMPRISING SUCH AN ACTIVE MATRIX

The invention relates to a TFT (thin film transistor) active matrix for an optical sensor, of the type which comprises:
- a substrate;
- a matrix of TFT transistors formed on this substrate, each transistor comprising a gate, a source and a drain;
- a set of row lines for controlling the TFT transistors by means of their gates, this set of row lines being placed on the substrate;
- a conducting level in a particular pattern forming a matrix of electrodes, each electrode defining a zone called a pixel; these electrodes being connected to the drains of the transistors;
- a set of column lines making it possible to transfer charge through the transistors between the electrodes and external electronics, the column lines being connected to the sources of the TFT transistors;
- an insulating layer between the electrodes and the column lines, this insulating layer being open locally over each pixel in order to put the pixel electrode in contact with the drain of the TFT transistor;
- a photosensitive semiconducting layer in contact with the pixel electrodes in order to convert the electromagnetic radiation into electric charges collected by the electrodes.

An active matrix of this type can be used in an optical sensor. The electromagnetic radiation which strikes the photosensitive semiconducting layer is converted into electric charges which are collected by the pixel electrodes. These electric charges are processed in an electronic circuit in order to reconstruct an image point by point, for example using liquid crystal displays (LCDs). One particular use of the TFT active matrix relates to producing images from X-rays, the semiconducting layer advantageously being made of selenium.

U.S. Pat. No. 5,780,871 shows an active matrix of this type having a high pixel aperture ratio which, however, leads to appreciable capacitive coupling between pixel electrodes and row lines, despite an insulating layer provided to counter this coupling; such capacitive coupling is disadvantageous to the quality of image desired.

A first aim of the invention is to improve the image reconstructed from an optical sensor equipped with a TFT active matrix as defined above.

To do this, according to a first provision of the invention, a pixel electrode is located completely inside an outline defined by two successive row lines and two successive column lines, a clearance being provided between the inner edge of this outline and the periphery of the pixel such that the pixel electrode covers neither the row lines nor the column lines.

Under these conditions, the capacitive coupling between pixel electrode and row and column lines is considerably reduced, which prevents undesirable charges leading to image degradation.

Decreasing the optical aperture, which results from decreasing the useful area of the pixel, does not lead to an appreciable decrease in charge recovery nor to a decrease in image quality.

This result seems to be due to the kinetic behavior of the carriers generated in a photosensitive semiconductor by the electromagnetic radiation. Because of a lateral field created by the carriers, the latter naturally move toward the pixel electrodes.

Thus, according to the invention, reducing the capacitive coupling obtained by decreasing the dimensions of the pixel electrode does not lead to problems with regard to charge recovery. The restored image quality is improved.

Preferably, the mean clearance between the outline of the pixel electrode and the external outline formed by the row and column lines is substantially equal to twice the alignment tolerance of a photorepeater which makes it possible to produce the images of various patterns and designs of circuits and electrodes on the resist of the plate.

The mean value of the clearance may be between 4 and 8 $\mu$m, preferably about 6 $\mu$m.

Advantageously, in the matrix defined above, the TFT transistor associated with each pixel is covered by the pixel electrode, and is thus protected.

The insulating layer provided between the electrodes and the column lines is advantageously formed by a photoresist or photoimageable resist.

According to a second aim of the invention, it is desired to improve the contrast of the images obtained, by having a high capacitance over the pixels, in order to store a lot of charge. This is because, the more charge is stored, the better the image contrast.

However, the embodiment should remain simple and the manufacturing yield should remain high, especially by avoiding the short-circuit faults due to impurities or to dust as far as possible.

According to a second provision of the invention, which may be used independently or in combination with the previous provision, the matrix comprises:
- a set of storage row lines forming capacitors with the pixel electrodes or drains, these storage row lines being parallel to the control row lines,
- and connections parallel to the column lines, forming bridges, provided in order to electrically connect the successive storage row lines and to make it possible, when controlling a row of pixels, to distribute the removal of charges from the entire row of pixels over several parallel storage row lines.

Preferably, the connections parallel to the column lines are at the same level as the column lines.

According to a first possibility, the storage row lines are provided in a level located on the substrate below the level of the control row lines; the storage row lines form a capacitor with the pixel electrodes or drains, or with a specific electrode made in the same level as the control row lines, and a thin insulating level is located between the level of the storage row lines and the level of the control row lines.

According to a second possibility, the storage row lines are substantially at the same level as the control row lines.

The number of connections parallel to the column lines may be equal to the number of column lines, that is one bridge per pixel. It is also possible to provide a number of parallel connections which is less than the number of column lines and therefore a number of bridges which is less than the number of pixels. In particular, a connection parallel to the column lines may be provided every sixteen column lines.

The high-capacitance zones defined by the stack of three layers, that is "storage row line level", "thin insulator", and "upper conducting level", define planar capacitors in which the thin insulator is never used alone in order to electrically separate a step of the "storage row line level" from an "upper conducting level". This makes it possible to improve the manufacturing yield.

Preferably, the pixel comprises a device for protecting against excessively high voltages, which is incorporated into the transistor, when working at negative voltage, or comprising a specific transistor and a diode when working at positive voltage.

The invention also relates to an optical sensor, in particular for X-rays, equipped with an active matrix as defined above.

Apart from the provisions mentioned above, the invention consists of a number of other provisions which will be more explicitly mentioned below by way of exemplary embodiments described with reference to the appended drawings, but which are in no way limiting.

FIG. 1 of these drawings is a plan view of a pixel of an active matrix according to the invention.

FIG. 5 is a plan diagram of a storage row line between two control row lines.

FIG. 6 is a schematic section along the line VI—VI of FIG. 5, on a different scale.

FIG. 8 is a vertical section of a variant embodiment of FIG. 3.

Finally, FIG. 9 is a vertical section illustrating a stack making it possible to produce a planar capacitor.

Figure 2:
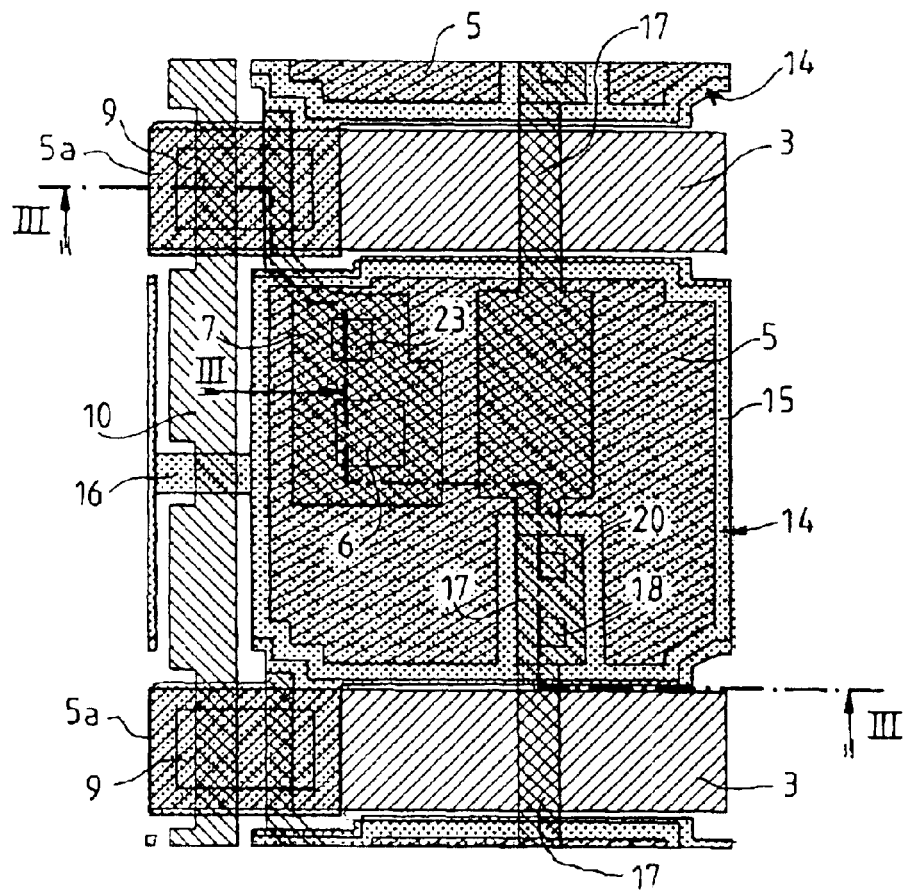
FIG. 2 is a plan view, on a smaller scale, of a pixel and of a connection parallel to the column lines.
Figure 3:
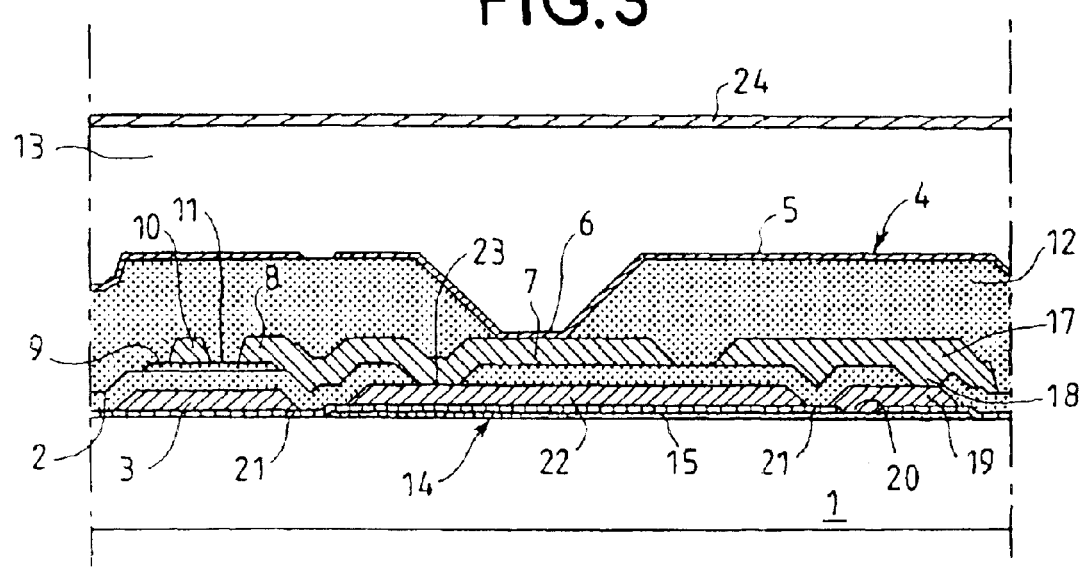
FIG. 3 is a section taken along the line III—III of FIG. 2.

Reference may now be made to the drawings, especially in FIG. 3, in which seven parallel vertical lines correspond to the seven changes in direction of the sectional line of FIG. 2.

Figure 1:
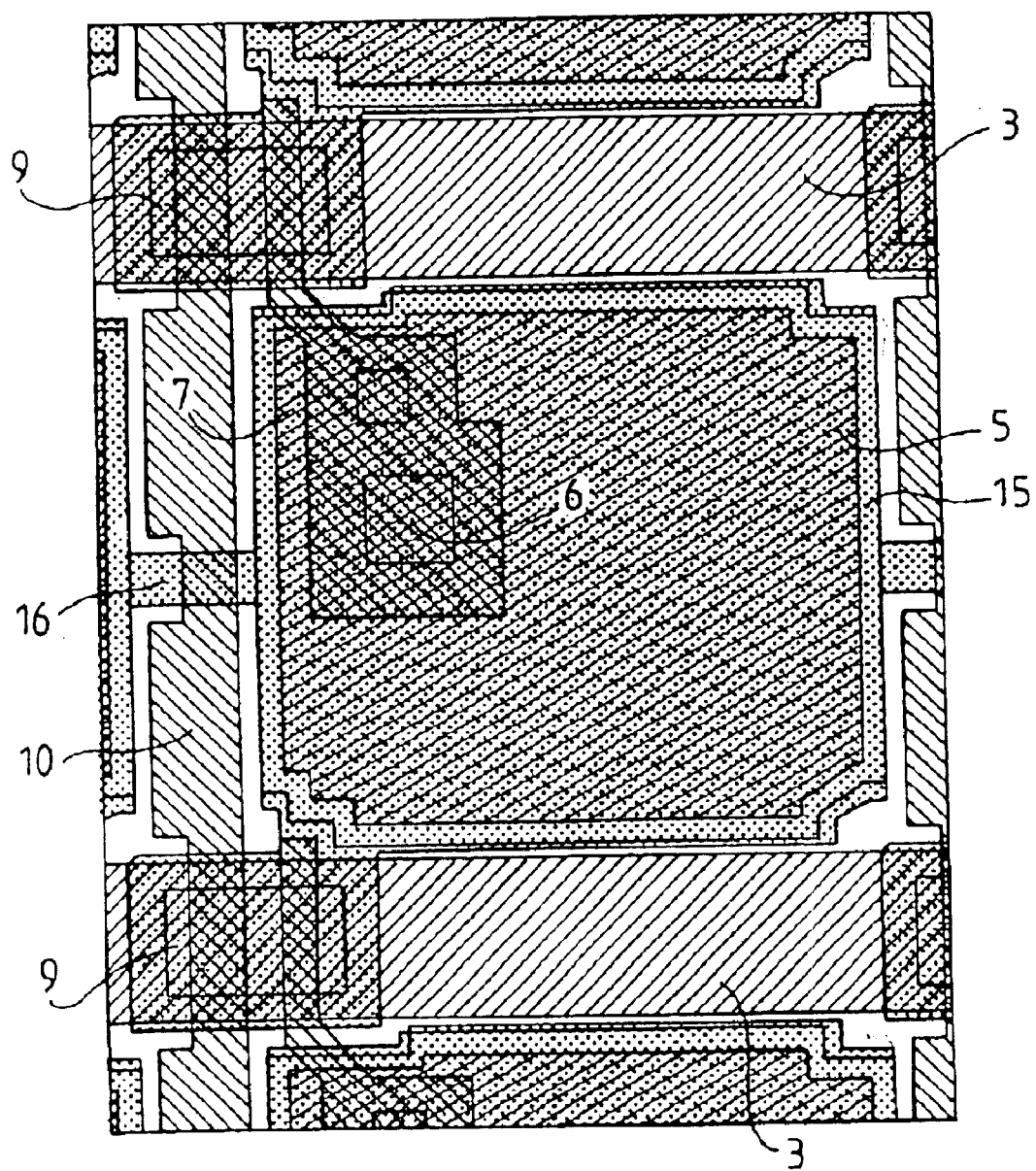

A TFT active matrix structure comprises, according to FIG. 3, from the bottom upward, a substrate 1 generally made of glass, an insulating gate layer 2, made of silicon nitride or an equivalent material, formed on this substrate; a set of row lines 3 for controlling the TFT transistors by forming their gate, this set 3 being placed on the substrate 1 under the layer 2. As can be seen in FIGS. 1 and 2, the row lines 3 are parallel and horizontal. The row lines 3 may be formed by a titanium/molybdenum bilayer.

A conducting level 4 produced according to a predetermined design or pattern forms a matrix of electrodes. Each electrode 5, of substantially rectangular or square shape, defines a zone called a pixel. Each electrode 5 is in contact, in a zone 6 forming the bottom of a cavity, with a metal conducting plate 7, for example made of molybdenum, one edge 8 of which goes over and in contact with a layer 9 of amorphous silicon, forming a TFT transistor. The layer 9 covers a zone of the layer 2, above the gate formed by the row line 3. The plate 7 forms the drain of the transistor.

A column line 10, consisting of a conducting strip, also bears against the layer 9 at some distance from the edge 8. The zone 11 of the layer 9, located above the gate 3 and between the column line 10 and the edge 8, forms the channel of the transistor. The column 10 forms the source of the transistor. The various column lines 10 are parallel to each other and vertical, according to the representation of FIG. 2.

An insulating layer 12 is provided between the pixel electrodes 5 and the column lines 10. The layer 12 has local apertures such that each pixel electrode 5 is in contact with the plate 7 by means of its part referenced 6.

A photosensitive semiconducting layer 13, in contact with the electrodes 5, is provided in order to convert the X-rays into electric charges which are collected by the electrodes 5. The layer 13 is advantageously made from selenium. This layer 13 is covered by an upper electrode 24 placed under a high voltage.

Figure 4:
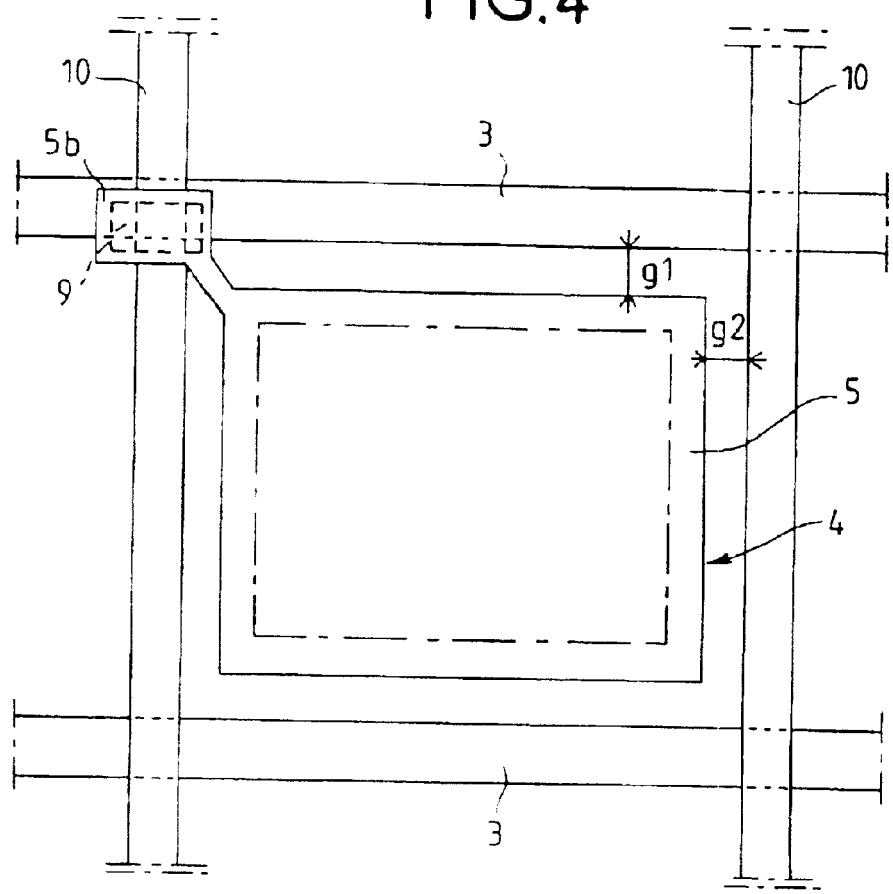
FIG. 4 is a diagram of a pixel surrounded by two successive control row lines and two successive column lines.

As illustrated in FIG. 4, the average outline of each substantially rectangular or square pixel electrode 5 is located completely inside an outline defined by two successive column lines 10 and two successive row lines 3.

Clearances g1 and g2 are provided respectively between the edges of the electrode 5 and the neighboring edges of the row lines 3 and of the column lines 10. These clearances g1, g2 are preferably identical and substantially equal to twice the alignment tolerance of a photorepeater which produces the various images corresponding to the patterns of the row lines, column lines and electrodes, by irradiating a resist.

The mean value of g1 and g2 is advantageously between 4 and 8 $\mu$m, preferably substantially equal to 6 $\mu$m for pixels 5 distributed over a pitch of about 150 $\mu$m (the pitch corresponds to the distance between the centers of the pixels 5).

With such a configuration, the electrode 5 of the pixel overlaps neither the row lines 3 nor the column lines 10 such that the undesirable capacitances between the pixel electrode 5 and the row and column lines are substantially reduced.

Although the area of the pixel electrode 5 is decreased, the electric charges are recovered by this electrode almost as well as if its optical aperture were appreciably greater and close to 100%, because of the lateral field created by the carriers, as explained above.

The result of this is a high quality image obtained from the electric charges recovered by the pixels.

To store a maximum number of electric charges on the pixel for the purpose of obtaining as good an image contrast as possible, a high capacitance has to be created on the pixel 5.

To do this, storage row lines 14 (FIGS. 2, 3 and 5) are provided, consisting of a metal conducting area, for example made of titanium, forming a ground bus. A row line 14, as illustrated in FIG. 5, consists of a succession of rectangular areas 15 located at a different level but facing a pixel electrode, so as to form the two plates of a capacitor. The areas 15 are connected by narrower strips 16 located at mid-width.

As is clearly shown by the section of FIG. 3, the ground bus or storage row line 14 is preferably not in the same plane as the control row lines 3 and is not superposed, even partially, over these row lines. The short-circuit defects which could be created by dust or impurities are considerably reduced compared to the situation where there is a superposition, or a juxtaposition.

The removal of charges by the storage row lines 14 (15, 16) is controlled by the transistors 9, schematically represented by circles in FIG. 5, in response to a signal provided on a suitable control row line 3.

The arrangement of the storage row lines 14 parallel to the control row lines 3 and separated therefrom, although having the advantage of reducing the risks of short circuits which would be clearly increased if the storage row lines were perpendicular to the row lines 3 and were to cross them several times, however creates the following problem.

Since the pixels are read horizontal row line by horizontal row line, when a read signal is sent to a row line 3, all the charges accumulated by the pixels of the associated row line must be removed by the ground bus 14 formed by the areas 15 and the strips 16 associated with the corresponding row of pixels (see FIG. 5).

Now the electrical resistance of the ground bus 14 is too high to allow the accumulated charges to flow away satisfactorily.

Figure 7:
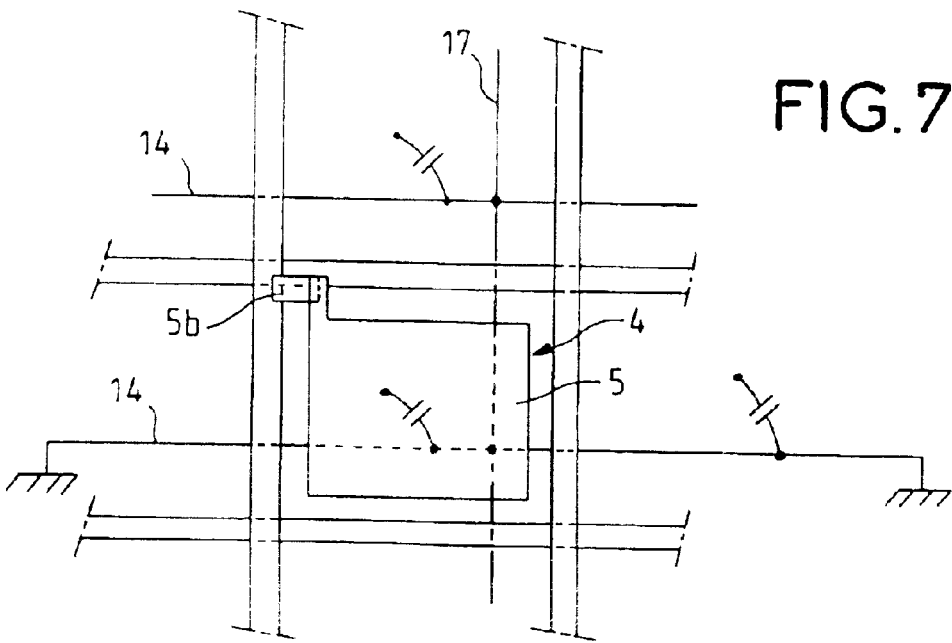
FIG. 7 is a circuit diagram illustrating the storage row lines.

To overcome this difficulty, connections 17 parallel to the column lines 10 and substantially at the same level are provided; the connections 17, schematically shown in FIG. 7, electrically connect the successive storage row lines 14. As can be seen in FIGS. 2 and 3, an electrical contact is established between a connection 17 and a storage row line 14 by means of a projection 18 in the shape of an inverted truncated pyramid bearing against a conducting plate 19. This plate 19 is itself placed on a projection 20, in the shape of an inverted truncated pyramid, made in a thin insulating layer 21 in order to come into contact with an area 15 of a storage row line 14.

Under these conditions, the charges from one row of pixels 5 can be removed by means of several storage row lines 14 in parallel, as is clearly visible in FIG. 7 where the capacitors formed between the row lines 14 and the pixel electrodes 5 are shown schematically. The row lines 14 are connected to a reference voltage.

One connection or bridge 17 per image element or pixel can be provided but the number of connections 17 may be less than the number of image elements or pixel.

Thus one bridge 17 can be provided for N column lines. In particular, a bridge 17 can be provided every sixteen column lines 10.

According to a first possibility, illustrated in FIG. 3, the storage row lines 14 are located on the substrate 1, below the level of the control row lines 3. A specific electrode 22, for example made of the same metal as that of the row lines 3, is provided at the same level as the control row lines 3 from which it is insulated. The electrode 22 is located under most of the pixel electrode 5, and is insulated from the plate 19 and the bridges 17. An electrical contact is established between the bottom 23 of a cavity provided in the plate 7 or drain, and the electrode 22. The thin insulating layer 21 separates the electrode 22 from the storage row line 14.

A storage capacitor is thus formed between the specific electrode 22, connected electrically to the pixel electrode 5, and the zone facing the row line 14.

Of course, it is possible to produce the storage capacitor directly between the pixel electrode 5, or the drain 7, and the row line 14, without using the specific electrode 22.

According to a second possibility, illustrated in FIG. 8, the storage row lines 14a are at the same level as the control row lines 3, and are parallel thereto. The storage capacitor is then formed directly between the pixel electrode 5, or the drain 7, and the row line 14a.

The high-capacitance zones (FIG. 9) defined by the stack of three layers, that is a conducting layer 14 forming a "level placed on the substrate", a "thin insulating" layer 21, and an upper conducting level B, define planar capacitors, that is to say that the thin insulator 21 is never used alone in order to electrically separate a step such as M and an upper conducting level. This makes it possible to improve the manufacturing efficiency and to avoid the short-circuit risks created by dust or impurities.

Furthermore, the pixel 5 may have a device for protecting against excessively high voltages. This protective device is incorporated into the transistor 9 when operating at a negative voltage applied to the upper electrode 24 above the selenium layer.

As can be seen in FIGS. 1, 2, 4 and 7, the TFT transistor 9 of each pixel is covered by the electrode of a pixel: each electrode 5 has, at its lower left corner in FIGS. 1 and 2 or at its upper left corner in FIGS. 4 and 7, a sort of rectangular pad 5a, 5b, projecting laterally and transversely, which covers the transistor. The result of this is that the transistor is protected against overvoltages.

If a positive voltage is applied to this electrode 24, the protective device may comprise a specific transistor or diode limiting the voltage applied to the pixel to a predetermined value.

An optical sensor equipped with an active matrix according to the invention performs particularly well because the elementary pixel 5 is optimized with regard to its design and its manufacture.

What is claimed is:

1. A TFT active matrix for an optical sensor comprising:
   a substrate;
   a matrix of TFT transistors formed on this substrate, each transistor comprising a gate, a source and a drain;
   a set of row lines for controlling the TFT transistors by means of their gates, this set of row lines being placed on the substrate;
   a conducting level in a particular pattern forming a matrix of electrodes, each electrode defining a zone called a pixel;
   a set of column lines making it possible to transfer charge through the transistors between the electrodes and external electronics, the column lines being connected to the sources of the TFT transistors;
   an insulating layer between the electrodes and the column lines, this insulating layer being open locally over each pixel in order to put the pixel electrode in contact with the drain of the transistor;
   a photosensitive semiconducting layer in contact with the pixel electrodes in order to convert the electromagnetic radiation into electric charges collected by the electrodes,
   a set of storage row lines forming capacitors with the pixel electrodes or drains,
   and connections, forming bridges, provided in order to electrically connect the successive storage row lines and to make it possible, when controlling a row of pixels, to distribute the removal of charges from the entire row of pixels over several parallel storage row lines,
   wherein the storage row lines are provided in a level located on the substrate below the level of the control row lines and a thin insulating level is located between the level of the storage row lines and the level of the control row lines.

2. The matrix as claimed in claim 1, wherein the storage row lines are parallel to the control row lines, the connections being parallel to the column lines.

3. The matrix as claimed in claim 1, wherein, the storage row lines form a capacitor with a specific electrode made in the same level as the control row lines and electrically connected to the pixel electrode.

4. The matrix as claimed in claim 1, wherein connections are parallel to the column lines and at the same level as the column lines.

5. The matrix as claimed in claim 1, wherein, the connections are parallel to the column lines and in equal numbers.

6. The matrix as claimed in claim 1, wherein the connections are parallel to the column lines, and less numerous.

7. The matrix as claimed in claim 6, comprising one connection parallel to the column lines every sixteen column lines.

8. The matrix as claimed in claim 1, wherein, high-capacitance zones defined by the stack of three layers formed with the storage row line level placed on the substrate, the thin insulator level, and an upper conducting level, said stack defining planar capacitors in which the thin insulator level is never used alone in order to electrically separate a step of the storage row line level from the upper conducting level.

9. The matrix as claimed in claim 1, comprising a device for protecting the pixel against voltages which are too high.

10. An optical sensor, in particular for X-rays, comprising a matrix as claimed in claim 1.

* * * * *

UNITED STATES PATENT AND TRADEMARK OFFICE
CERTIFICATE OF CORRECTION

| | | |
|---|---|---|
| PATENT NO. | : 6,815,716 B2 | Page 1 of 1 |
| APPLICATION NO. | : 10/380757 | |
| DATED | : November 9, 2004 | |
| INVENTOR(S) | : Eric Sanson | |

It is certified that error appears in the above-identified patent and that said Letters Patent is hereby corrected as shown below:

Title Page 1, please add Item No. [30]:

-- (30) Foreign Application Priority Data

September 19, 2000    (FR)................00/11927 --

Signed and Sealed this

Nineteenth Day of February, 2008

JON W. DUDAS
*Director of the United States Patent and Trademark Office*